United States Patent [19]

Tsuda

[11] Patent Number: 5,518,856
[45] Date of Patent: May 21, 1996

[54] MICROCAPSULE SUITABLE FOR ELECTROSTATICALLY COATING ON SUBSTRATE

[75] Inventor: Masashi Tsuda, Haguri, Japan

[73] Assignee: Brother Kogyo Kabushiki Kaisha, Aichi, Japan

[21] Appl. No.: 219,234

[22] Filed: Mar. 28, 1994

Related U.S. Application Data

[63] Continuation of Ser. No. 894,657, Jun. 5, 1992, abandoned.

[30] Foreign Application Priority Data

Jun. 5, 1991 [JP] Japan ................... 3-134090
Jun. 5, 1991 [JP] Japan ................... 3-134091

[51] Int. Cl.$^6$ .................... G03C 1/72; B01J 13/16; G03G 5/00
[52] U.S. Cl. .................. 430/138; 252/600; 264/4.33; 264/4.7; 428/402.21; 430/964
[58] Field of Search .................. 264/4.33; 428/402.2, 428/402.21, 402.22; 430/109, 110, 138, 964; 8/526; 252/600

[56] References Cited

U.S. PATENT DOCUMENTS

| 4,051,077 | 9/1977 | Fisher | 430/110 |
|---|---|---|---|
| 4,091,122 | 5/1978 | Davis et al. | 427/151 X |
| 4,228,216 | 10/1980 | Austin et al. | 428/402.21 X |
| 4,254,201 | 3/1981 | Sawai et al. | 430/138 X |
| 4,314,017 | 2/1982 | Takahashi et al. | 430/109 |
| 4,465,755 | 8/1984 | Kiritani et al. | 430/138 X |
| 4,578,339 | 3/1986 | Adkins | 428/402.21 X |
| 4,681,829 | 7/1987 | Grushkin | 430/109 |
| 4,780,390 | 10/1988 | Hosoi | 430/138 |
| 4,960,750 | 10/1990 | Hammann IV et al. | 430/138 X |

FOREIGN PATENT DOCUMENTS

| 62-227162 | 10/1987 | Japan . | |
|---|---|---|---|
| 2-173760 | 7/1990 | Japan | 430/109 |

*Primary Examiner*—Richard D. Lovering
*Attorney, Agent, or Firm*—Oliff & Berridge

[57] ABSTRACT

Microcapsule has a shell encapsulating a liquid-phase material containing at least a dye precursor and a radiation curable component therein. The liquid-phase material is cured when predetermined wavelength light is applied thereto. The shell is made of electron accepting or electron supplying material, so that the microcapsule is readily charged to either positive or negative polarity. Very fine particles may be attached to the surface of the shell, wherein the particles are made of a material which can be readily charged to positive or negative polarity.

8 Claims, 1 Drawing Sheet

MICROCAPSULE SUITABLE FOR ELECTROSTATICALLY COATING ON SUBSTRATE

This is a continuation of application Ser. No. 07/894,657 filed Jun. 5, 1992, now abandoned.

BACKGROUND OF THE INVENTION

The present invention relates to an improvement of a microcapsule suitable for electrostatically coating on a substrate to produce a photosensitive sheet for use in an image recording apparatus.

There has been known an image recording apparatus which uses a photosensitive recording medium and a developer sheet. The photosensitive recording medium has a surface coated with an immense number of photocurable microcapsules encapsulating dye precursor and photopolymerizable material therein. The recording medium is exposed to imaging light to selectively photocure the microcapsules. The developer sheet has a substrate such as a plain paper coated with a developer material which reacts with the dye precursor. The exposed recording medium and the developer sheet are brought into facial contact with each other and are applied with pressure to rupture the uncured microcapsules and react the dye precursor released from the ruptured microcapsule with the developer material, thereby forming an image on the developer sheet.

Generally, the substrate of the photosensitive medium is made of, for example, polyethyleneterephthalate or polyimide, and the microcapsules are coated thereon using binders such as polyvinyl alcohol, polyacrylic acid sodium, polyethylene. Despite the fact that such substrate materials are expensive, the photosensitive medium can only be used once in the image recording apparatus, thus not advisable from economical viewpoint.

To obviate such a problem, microcapsule coating apparatuses have been proposed in the art. One proposed apparatus electrostatically coats the microcapsules on the substrate, but there is a difficulty in controlling charges on the microcapsules. Japanese Laid-Open Patent Publication No. 62-227162 proposes attaching polymer of vinylmonomer to the surface of the microcapsule to stabilize the frictional chargeability of the microcapsule.

However, the proposed solution is still unsatisfactory because the polymer of vinyl monomer is attached to the surface of the microcapsule using polymerization reaction after the microcapsules have been produced, hence the procedure is complicated and it takes long time.

SUMMARY OF THE INVENTION

The present invention has been made to solve the above problem and accordingly it is an object of the present invention to provide a microcapsule whose chargeability can be controlled and which can be produced with a simple procedure and short period of time.

To achieve the above and other objects, the present invention provides a microcapsule comprising a spherical shell, and a liquid-phase material containing at least a dye precursor and a radiation curable material. The radiation curable material is cured when exposed to predetermined wavelength light. The liquid-phase material is encapsulated in the shell which is made of a material readily electrically charged to either positive or negative polarity.

In accordance with another aspect of the invention, there is provided a microcapsule comprising a spherical shell, a liquid-phase material containing at least a dye precursor and a radiation curable material, and fine particles attached to the outer surface of the shell. The fine particle is made of a material which is readily electrically charged to either positive or negative polarity.

BRIEF DESCRIPTION OF THE DRAWINGS

The particular features and advantages of the invention as well as other objects will become apparent from the following description taken in connection with the accompanying drawings, in which.

DETAILED DESCRIPTION OF THE PREFERRED EMBODIMENTS

Figure 1:
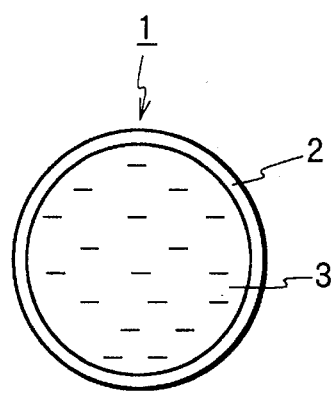
FIG. 1 is an enlarged cross-section of a microcapsule in accordance with a first embodiment of the present invention.

A first embodiment of the present invention will be described with reference to FIG. 1.

As shown, a microcapsule 1 is made up of a spherical shell 2, and a liquid-phase component 3 encapsulated in the shell 2. It is preferable that the outer diameter of the microcapsule 1 be in the range of from several microns to several tens microns. However, the outer diameter thereof may be less than 1 micron or more than 100 microns depending upon the case.

The liquid-phase component 3 contains at least radiation curable material which is cured in response to a predetermined wavelength light, and dye precursor or dye. The dye precursor is colored when it reacts with a developer material. The radiation curable materials are typically selected from a photopolymerization resin which may be, for example, ethylene group unsaturated compound such as trimethylpropane, or acylate prepolymer. Generally, one of these materials and a photopolymerization initiator are used in combination for the radiation curable material. The photopolymerization initiator is a material which is sensitive to light and initiates polymerization of the resin. For example, the benzoylalkylether group such as benzophenone, benzoylisopropylether; Michler's ketone; or 2,4-diethylthixanthone are the radiation curable material.

Triarylmethane compound, bisphenylmethane compound, xanthane compound, thiazine compound, spiropirane compound or a mixture thereof are used for the dye precursor. The spherical shell 2 of the microcapsule 1 is made of a material which is readily charged to positive or negative polarity. Materials which are readily charged to positive polarity are compounds having ammonium group, amino group, or hydroxide group electron supplying components. Materials which are readily charged to negative polarity are compounds having nitro group, sulfone group, carboxyl group, or halogen group electron accepting components. These compounds or polymers are composed using a material having a group which is readily charged to positive or negative polarity, to be described later on.

The microcapsule 1 is manufactured by way of coacervation or interface polymerization well known in the art to encapsulate the liquid-phase component 3 containing radiation curable material or dye precursor. In order that the spherical shell 2 may be readily charged to positive or negative polarity, it is necessary to select a suitable material for the spherical shell 2.

The following description is directed to a manufacturing process of a microcapsule 1 whose spherical shell 2 is made of nylon which is readily charged to positive polarity. In the spherical shell 2, the liquid-phase component 3 such as radiation curable material and dye precursor are encapsulated.

1.5 g terephthaloyl dichloride is dissolved in a 5 to 10 ml hydrophobic organic solvent, and 0.2 g leuco dye, 10 to 15 ml acrylic monomer and 1 ml benzoylalkyl ether such as benzophenone or benzoylisopropyl ether are added thereto. The resultant solvent will hereinafter referred to as "A solvent". Sodium hydroxide is added to 1% aqueous solution of hexamethylenediamine so as to be 0.6% in density. The resultant solvent will hereinafter referred to as "B solvent". Then, a surface active agent is appropriately selected which does not react with terephthaloyl dichloride and the hydrophobic organic solvent and is solved in water to have 0.1 to 0.3% aqueous solution. The resultant solution will hereinafter referred to as "C solvent".

100 ml C solvent is added with stirring to A solvent to produce an O/W emulsion. The resultant O/W emulsion is added to 300 ml B solvent. Then an interface polymerization reaction occurs at the interface of the O/W emulsion and the microcapsule 1 is immediately produced which has the spherical shell 2 encapsulating the liquid-phase component 3 such as the radiation curable material or dye precursor.

The polymer that is the spherical shell 3 of the microcapsule 1 produced according to the interface polymerization reaction is polyamide (nylon) having an amino group which has an electron supplying feature. Thus the polymer is readily charged to positive polarity and charging control of the microcapsule can easily be achieved. By further adding a substance that is used in another electron charge controlling agent, the charge controlling capability can further be enhanced.

A second embodiment of the present invention will be described with reference to FIG. 2. The same reference numerals as those used in FIG. 1 denotes the same parts or the same material in FIG. 2, and duplicate description thereof is omitted herein.

Figure 2:
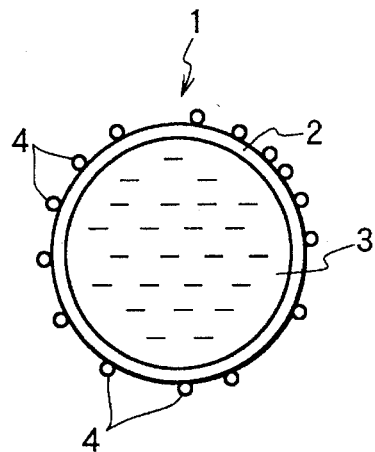
FIG. 2 is an enlarged cross-section of a microcapsule in accordance with a second embodiment of the present invention.

In comparison with the first embodiment shown in FIG. 1, the microcapsule of FIG. 2 has very fine particles 4 attached to the outer surface of a shell 2. It is desirable that the diameter of the particle 4 be about one tenth (1/10) of the outer diameter of the microcapsule 1 which is generally in the range of from several microns to several tens microns, as previously mentioned.

As a material of the very fine particle 4, electron accepting materials such as nylon, colloidal silica are used when it is desired that the microcapsule be charged to negative polarity, while electron supplying materials such as polyethylene, vinyl chloride are used when it is desired that the microcapsule be charged to positive polarity. To have the surface of the microcapsule electrically conductive, metals are used for the very fine particle. It is to be noted that the materials of the very fine particles 4 are not limited to those listed above. The particles 4 can be attached to the surface of the shell 2 by way of well known method such as used in improving the surface of a powder particle. Specifically, by simply mixing the microcapsules 1 and the particles 4 with a mixing device, the particles 4 are attached to the surface of the shell 3. The particles 4 can be firmly and fixedly attached thereto by the application of heat thereto.

Next, a microcapsule coating apparatus will be described with reference to FIG. 3. The apparatus is provided for coating the microcapsules 1 over the surface of a substrate such as film or web-like belt to provide the photosensitive medium. Both types of the microcapsules shown in FIGS. 1 and 2 are applicable to the apparatus shown in FIG. 3.

Figure 3:
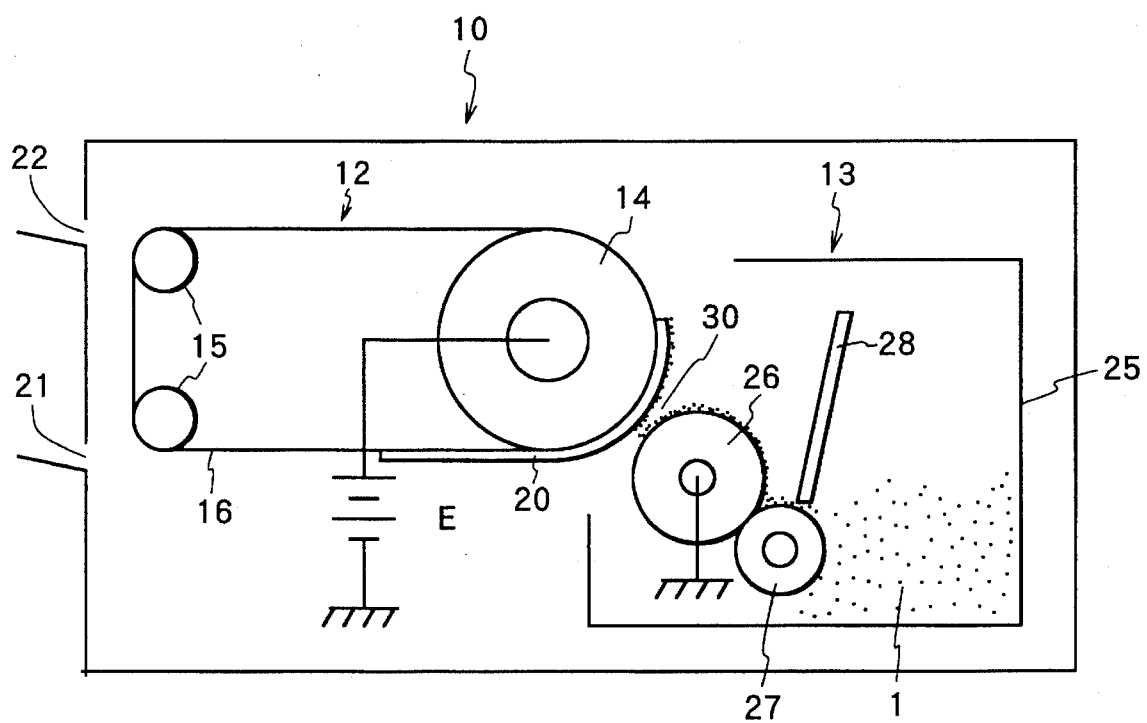
FIG. 3 is a vertical cross-section showing a microcapsule coating apparatus.

Referring to FIG. 3, the microcapsule coating apparatus 10 includes a transportation unit 12 for transporting a film 20 on which the microcapsules 1 are to be coated, and a microcapsule coating unit 13 for coating the microcapsules 1 on the film 20. The coating apparatus 10 has an outer wall formed with a lower port 21 for inserting the film 20 into the apparatus 10 and an upper port 22 for taking the microcapsule coated film, i.e., the photosensitive medium 20 out of the apparatus 10.

The transportation unit 12 has an electrode roller 14 rotatable about its own axis extending in a direction perpendicular to the sheet of drawing, a pair of feed rollers 15, and an endless belt 16 stretched between the rollers 14 and 15. A high voltage source E is connected to the electrode roller 14.

The microcapsule coating unit 13 is made up of a reservoir called hopper 25 storing microcapsules 1 therein, a microcapsule carrying roller 26, and a relay roller 27 auxiliarily provided for bringing the microcapsules 1 on the periphery of the roller 26. A regulating blade 28 is provided in a position slightly spaced apart from the surface of the relay roller 27 or in contact with the periphery of the relay roller 27 so that the microcapsules 1 are not excessively supplied onto the periphery of the roller 26.

In operation, when a driving means such as a motor (not shown) is energized, both the rollers 26 and 27 are rotated in counterclockwise direction and the microcapsules 1 are held on the peripheral surface of the roller 26. At this time, an amount of the microcapsules 1 to be held on the surface of the roller 26 is regulated by means of the regulating blade 28. The shell 2 of the microcapsule 1 is easily charged to either of the polarities so that individual microcapsule is charged when it frictionally contacts another microcapsules 1. In the microcapsule 1 of the type shown in FIG. 2, the fine particles 4 serve to enhance the charging capability of the microcapsule 1. The microcapsules in its entirety are electrically neutral, since about a half of the microcapsules are charged to positive polarity and the rest of the microcapsules are charged to negative polarity. All of the microcapsules can be uniformly charged to either positive or negative, if necessary. This can be done by using such materials in the hopper 25 and the rollers 26 and 27 that are readily charged to a polarity opposite to the polarity of the microcapsules 1. The charged microcapsules are held on the roller 26 and are relayed onto a transfer region 30 of the film 20.

The film 20 on which the microcapsules 1 are to be coated is inserted interiorly of the apparatus 10 through the lower port 21. The film 20 thus inserted is attracted onto the conveyor belt 16 and is conveyed toward the transfer region 30 in accordance with rotations of the rollers 14 and 15. The electrode roller 14 is made of a metal, to which a high voltage is applied from the D.C. power source E. As such, an electric field extends in the transfer region 30 and its neighboring region.

The microcapsules 1 carried on the roller 26 are attracted onto the surface of the electrode roller 14 due to electrostatic force induced in accordance with the electric field. The film 20 is interposed between two rollers 14 and 26, resulting in coating of the microcapsules on the film 20. The film 20 thus coated with the microcapsules 1 is then transported by the transportation unit 12 and is discharged out of the apparatus 10 through the upper port 22.

The microcapsule coating apparatus as described can be modified so as to directly coat the microcapsules on the surface of the endless belt 16. In this modification, it is necessary that a transferring means be separately provided for transferring the microcapsules carried by the belt onto a substrate of the photosensitive medium.

The photosensitive medium carries on its surface an immense number of above-described microcapsules. In an image recording apparatus, the photosensitive medium is exposed to imaging light to selectively photocure the microcapsules to thus form a latent image thereon. The developer sheet is used in conjunction with the photosensitive medium, which has a substrate made of, for example, a plain sheet on which a developer material is coated. The dye precursor reacts with the developer material and is colored. To reproduce an image, the latent image formed sheet is brought into facial contact with the developer sheet and a pressure development is taken place by the use of pressurizing rollers. The microcapsules which remain uncured are ruptured by the rollers and the dye precursor released from the ruptured microcapsules reacts with the developer material, thereby forming the image on the developer sheet.

Although the present invention has been described with respect to specific embodiments, it will be appreciated by one skilled in the art that a variety of changes and modifications may be made without departing from the scope of the invention. For example, any materials are usable in forming the shell of the microcapsule insofar as they can readily be charged to positive or negative polarity.

As described, the material of the microcapsule shell or the very fine particle attached to the surface of the shell is readily charged to negative or positive polarity, the charging of the microcapsule can easily be controlled. Further, since the shell can be formed simultaneously with the formation of the microcapsule, the production of the microcapsules can be simply carried out with less time.

What is claimed is:

1. A microcapsule comprising: a shell made of a material; and a liquid-phase material containing at least a coloring agent and a radiation curable material, the radiation curable material being cured when exposed to predetermined wavelength light, said liquid-phase material containing said coloring agent and said radiation curable material being encapsulated in said shell wherein said shell is made of a material which is readily electrically charged to either positive or negative polarity, wherein the shell material (1) has an electron supplying feature and comprises a compound having a member selected from the group consisting of ammonium group and hydroxide group or (2) has an electron accepting feature and comprises a compound having a member selected from the group consisting of nitro group, sulfone group, carboxyl group and halogen group.

2. The microcapsule according to claim 1, wherein the material of said shell is substantially free of electroconductivity.

3. The microcapsule according to claim 1, wherein the shell material has an electron accepting feature (2).

4. The microcapsule according to claim 1, wherein the shell material has an electron supplying feature (1) and comprises a compound having an ammonium group.

5. The microcapsule according to claim 1, further comprising fine particles attached to the outer surface of said shell.

6. The microcapsule according to claim 5, wherein the outer diameter of said shell is 1 μ to 100 μ in size.

7. The microcapsule according to claim 6, wherein the diameters of said fine particles are about 1/10 of the outer diameter of said shell.

8. The microcapsule according to claim 5, wherein said particles are selected from the group consisting of nylon, colloidal silica, polyethylene, vinyl chloride and metal.

\* \* \* \* \*